(12) United States Patent
Miyoshi

(10) Patent No.: US 7,673,385 B2
(45) Date of Patent: Mar. 9, 2010

(54) LAMINATED STRUCTURE METHOD

(75) Inventor: Tetsu Miyoshi, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 428 days.

(21) Appl. No.: 11/562,253

(22) Filed: Nov. 21, 2006

(65) Prior Publication Data

US 2007/0093051 A1    Apr. 26, 2007

Related U.S. Application Data

(62) Division of application No. 10/928,148, filed on Aug. 30, 2004, now abandoned.

(30) Foreign Application Priority Data

Sep. 1, 2003   (JP)   ............... 2003-308880

(51) Int. Cl.
*H05K 3/30* (2006.01)
*H01L 21/4763* (2006.01)

(52) U.S. Cl. ............ 29/832; 29/25.35; 29/623.4; 29/831; 29/609; 438/622

(58) Field of Classification Search ........ 29/25.35, 29/830, 831, 832, 854, 623.4, 857, 609; 361/301.4, 361/305, 306.311; 310/311, 332, 363, 364; 438/622; 257/E23

See application file for complete search history.

(56) References Cited

U.S. PATENT DOCUMENTS 4,087,716 A * 5/1978 Heywang ............... 310/332
5,438,232 A * 8/1995 Inoue et al. .............. 310/328
6,212,057 B1 * 4/2001 Kohara et al. ........... 361/301.4
2003/0107867 A1   6/2003 Iwase et al.

FOREIGN PATENT DOCUMENTS

| JP | 2000-357631 |   | 12/2000 |
| JP | 2001-156351 A |   | 6/2001 |
| JP | 2003-069102 |   | 3/2003 |
| JP | 2005-038916 |   | 2/2005 |
| JP | 2005-279953 | * | 10/2005 |

* cited by examiner

*Primary Examiner*—Derris H Banks
*Assistant Examiner*—Tai Nguyen
(74) *Attorney, Agent, or Firm*—Sughrue Mion, PLLC

(57) ABSTRACT

A laminated structure having an electrode hard to peel off and a method of manufacturing the laminated structure. The laminated structure has: a backing substrate; a lower electrode including an adhesive layer containing a metal oxide and a conductive layer formed on the backing substrate with the adhesive layer therebetween; a dielectric layer disposed on the lower electrode; and an upper electrode disposed on the dielectric layer. Further, the method includes the steps of: (a) disposing a lower electrode by forming a conductive layer on a backing substrate with an adhesive layer containing a metal oxide therebetween; (b) disposing a dielectric layer by spraying powder of a dielectric material to the lower electrode for deposition; (c) heat-treating the dielectric layer; and (d) forming an upper electrode on the dielectric layer before or after step (c).

5 Claims, 6 Drawing Sheets

1

LAMINATED STRUCTURE METHOD

CROSS REFERENCE TO RELATED APPLICATIONS

This application is a Divisional application of U.S. application Ser. No. 10/928,148 filed Aug. 30, 2004; the entire disclosure of which is incorporated herein by reference.

BACKGROUND OF THE INVENTION

1. Field of the Invention

The present invention relates to a laminated structure, in which opposed electrodes are provided, to be used in piezoelectric pumps, piezoelectric actuators, ultrasonic transducers and so on, and further relates to a method of manufacturing the laminated structure and the piezoelectric actuator.

2. Description of a Related Art

Laminated structures in each of which dielectric layers of piezoelectric materials or the like and electrode layers are alternately stacked, are utilized, in various uses such as capacitors, piezoelectric pumps, piezoelectric actuators and ultrasonic transducers. As such laminated structure, not only a single-layer structure in which electrodes are formed on both ends of a dielectric layer, but also a multi-layer structure in which plural dielectric layers and electrode layers are alternately formed is used. By connecting the stacked plural layers in parallel, the capacitance between electrodes of the entire laminated structure can be enlarged even having a small size, and thereby, rise in electric impedance can be suppressed. In recent years, with the developments of MEMS (micro electromechanical systems) related devices and equipment, elements each having such a laminated structure have been microfabricated still further and packaged more densely.

By the way, in order to efficiently apply a voltage to the dielectric layer, it is important that the dielectric layer and the electrode layer are in close contact. In the case where an element employing a piezoelectric material as a dielectric is fabricated, generally, platinum (Pt) having low reactivity to a piezoelectric material is used as an electrode material. However, platinum provides low adhesion to a piezoelectric material, a substrate, or the like. Accordingly, it has been practiced to further provide a titanium (Ti) layer to make an electrode to have a double structure in order to bring platinum into close contact with an under layer material.

However, in the manufacturing process of an element, generally, firing of a piezoelectric material is performed, and, at that time, the adhesive layer of titanium or the like is oxidized by oxygen transmitted through the platinum. As a result, bonding force between the piezoelectric material and the adhesive layer becomes weak and the electrode peels off the piezoelectric material. Further, sometimes the electrode peels off the piezoelectric material due to difference between coefficients of thermal expansion of the piezoelectric material and the electrode material.

In order to prevent the separation at an interface between a piezoelectric film and an electrode, Japanese Patent Application Publication JP-P2001-156351A discloses a laminated structure electrode including a piezoelectric film formed on an Si substrate, on which an electrode film is disposed, according to a gas deposition method, characterized in that the electrode film is made of one or more kind of material(s) and has a thickness of more than 0.15 µm. In JP-P2001-156351A (page 1, FIG. 1), an electrode in which three kinds of metals of platinum, iridium (Ir) and tantalum (Ta) are stacked is used as a lower electrode of the piezoelectric film. That is, by inserting an iridium layer, through which oxygen is difficult to be transmitted, between a platinum layer and a tantalum layer as an adhesive layer to a substrate underneath, the oxygen transmitted through the platinum layer is prevented from penetrating the tantalum layer.

The electrode having such structure is effective when used as a lower electrode of a structure having a single-layered piezoelectric material layer. However, in the case where the electrode having such structure is used as an internal electrode of the laminated structure in which plural piezoelectric material layers are stacked, oxygen penetrates not only from the upper piezoelectric material layer but also from the lower piezoelectric material layer, and thereby, the electrode similarly peels off.

SUMMARY OF THE INVENTION

The present invention has been achieved in view of the above-described problems. An object of the present invention is to provide a laminated structure having an electrode hard to peel off, a piezoelectric actuator including such laminated structure and a method of manufacturing the laminated structure and the piezoelectric actuator.

In order to solve the above-described problems, a laminated structure according to a first aspect of the present invention includes: a backing substrate; a first electrode including an adhesive layer containing a metal oxide and a conductive layer formed on the backing substrate with the adhesive layer therebetween; a dielectric layer disposed on the first electrode; and a second electrode disposed on the dielectric layer.

Further, a laminated structure according to a second aspect of the present invention includes: at least one intermediate electrode; and a plurality of dielectric layers stacked with the at least one intermediate electrode therebetween; wherein the at least one intermediate electrode includes an adhesive layer containing a metal oxide and a conductive layer formed on the dielectric layer with the adhesive layer therebetween.

Furthermore, a piezoelectric actuator according to one aspect of the present invention includes: a laminated structure including a plurality of piezoelectric layers, a first intermediate electrode and a second intermediate electrode stacked in the order of the piezoelectric layer, the first intermediate electrode, the piezoelectric layer and the second intermediate electrode; a first side electrode disposed in a first side region of the laminated structure; and a second side electrode disposed in a second side region different from the first side region of the laminated structure, wherein each of the first and second intermediate electrodes includes an adhesive layer containing a metal oxide and a conductive layer formed on the dielectric layer with the adhesive layer therebetween, the first intermediate electrode is connected to the first side electrode and insulated from the second side electrode, and the second intermediate electrode is connected to the second side electrode and insulated from the first side electrode.

A method of manufacturing a laminated structure according to the first aspect of the present invention includes the steps of: (a) disposing a first electrode by forming a conductive layer on a backing substrate with an adhesive layer containing a metal oxide therebetween; (b) disposing a dielectric layer on the first electrode by spraying powder of a dielectric material to the first electrode for deposition; (c) heat-treating the dielectric layer; and (d) forming a second electrode on the dielectric layer before or after step (c).

A method of manufacturing a laminated structure according to the second aspect of the present invention includes the steps of: (a) disposing a first electrode by forming a conductive layer on a backing substrate with an adhesive layer containing a metal oxide therebetween; (b) disposing a dielectric layer on the first electrode by spraying powder of a dielectric material to the first electrode for deposition; (c) disposing a second electrode by forming a conductive layer on the dielectric layer with an adhesive layer containing a metal oxide therebetween; (d) disposing a dielectric layer on the second electrode by spraying powder of a dielectric material to the second electrode for deposition; (e) heat-treating the dielectric layers; and (f) forming, before or after step (e), a third electrode on the dielectric layer disposed at step (d).

A method of manufacturing a laminated structure according to a third aspect of the present invention includes the steps of: (a) disposing a dielectric layer by spraying powder of a dielectric material to a backing substrate for deposition; (b) disposing a first electrode by forming a conductive layer on the dielectric layer with an adhesive layer containing a metal oxide therebetween; (c) disposing a dielectric layer on the first electrode by spraying powder of a dielectric material to the first electrode for deposition; (d) heat-treating the dielectric layers; (e) forming, before or after step (d), a second electrode on the second dielectric layer disposed at step (c); and (f) removing the backing substrate from the dielectric layer.

A method of manufacturing a piezoelectric actuator having a laminated structure according to one aspect of the present invention includes the steps of: (a) disposing a first piezoelectric layer by spraying powder of a piezoelectric material to a backing substrate for deposition; (b) disposing a first intermediate electrode by forming a conductive layer on the piezoelectric layer with an adhesive layer containing a metal oxide therebetween; (c) disposing a piezoelectric layer on the first intermediate electrode by spraying powder of a piezoelectric material to the first intermediate electrode for deposition; (d) disposing a second intermediate electrode by forming a conductive layer on the piezoelectric layer with an adhesive layer containing a metal oxide therebetween; (e) disposing a piezoelectric layer on the second intermediate electrode by spraying powder of a piezoelectric material to the second intermediate electrode for deposition; (f) heat-treating the piezoelectric layers; (g) removing the backing substrate from the piezoelectric layer; and (h) forming side electrodes on at least first and second surfaces of the laminated structure.

According to the present invention, since the conductive layer is formed on the backing substrate or the dielectric layer with the adhesive layer for bringing the conductive layer into close contact with the under layer, in the heat-treating step of the laminated structure, the electrode can be prevented from peeling off the under layer even if oxygen is generated or stress is generated due to the difference between coefficients of thermal expansion. Further, since the metal oxide is used as the adhesive layer, the electrode can be prevented from peeling off due to oxidization. Therefore, by employing such laminated structure, manufacture yield of the piezoelectric actuator can be improved.

DESCRIPTION OF THE PREFERRED EMBODIMENTS

Figure 1:
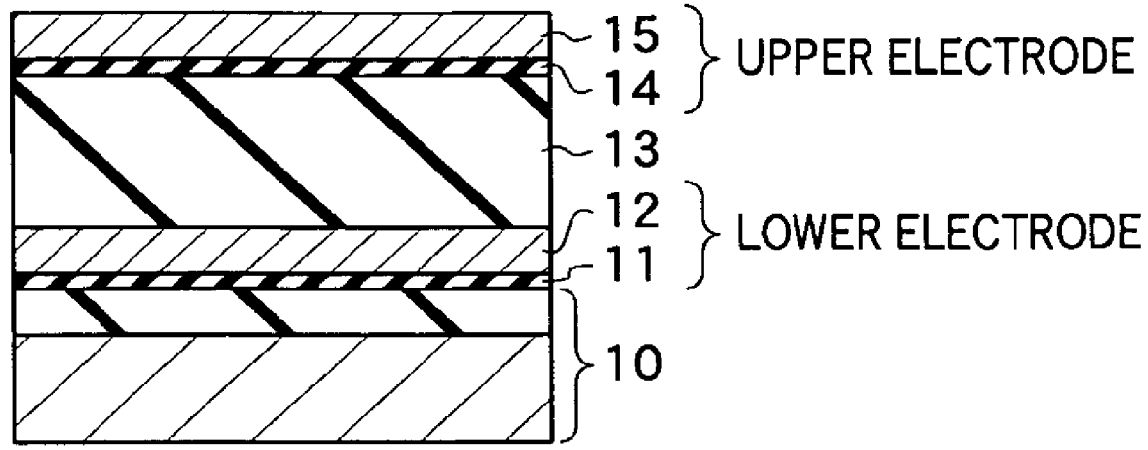
FIG. 1 is a sectional view showing a laminated structure according to the first embodiment of the present invention.

Hereinafter, preferred embodiments of the present invention will be described in detail by referring to the drawings. The same component elements are assigned with the same reference numerals and the description thereof will be omitted.

FIG. 1 is a sectional view showing a laminated structure according to the first embodiment of the present invention.

The laminated structure 1 is a micro columnar structure having a bottom surface with sides of about 0.2 mm to 1.0 mm and a height of about 1.0 mm for example. The laminated structure 1 includes a substrate 10, a lower electrode having an adhesive layer 11 and a conductive layer 12, a dielectric layer 13 and an upper electrode having an adhesive layer 14 and a conductive layer 15.

The laminated structure according to the embodiment employs a piezoelectric material PZT (Pb (lead) zirconate titanate) as the dielectric layer 13. By applying a voltage to the PZT layer via the electrodes, the PZT layer expands and contracts by the piezoelectric effect. Such laminated structure is used for a piezoelectric pump, a piezoelectric actuator, an ultrasonic transducer for transmitting and receiving ultrasonic waves in an ultrasonic probe and so on.

The substrate 10 is for backing the structure laminated thereon. The substrate 10 is formed by employing silicon (Si) for example, and an insulating film ($SiO_2$) is formed on the upper surface thereof for electrically insulating the layer formed thereon.

In the lower electrode, the conductive layer 12 is used for applying a voltage to the dielectric layer 13. As the conductive layer 12, a metal material such as platinum (Pt), ruthenium (Ru), iridium (Ir), rhenium (Re), osmium (Os), rhodium (Rh) or a metal oxide containing at least one of those metals can be used. In this embodiment, platinum is used.

The conductive layer 12 has a thickness of about 300 nm. The reason is as follows. In the embodiment, the dielectric layer 13 is formed on the conductive layer 12 in accordance with the injection deposition method of spraying powder of a material to the under layer for deposition. The spray deposition method is also called an aerosol deposition method or a gas deposition method, and, hereinafter, referred to as "AD (aerosol deposition) method". In the AD method, a phenomenon that the powder of deposited material cuts into the electrode layer of the under layer (referred to as "anchoring") is produced. The thickness of the anchor layer (the layer into which the powder cuts) produced by the anchoring is normally on the order of 10 nm to 300 nm, which differs according to the material of the under layer (electrode layer), powder velocity or the like. Accordingly, in order to sufficiently produce anchoring to make the conductive layer in close contact with the dielectric material layer and in order to allow it to function well as a conductive layer, it is desired that the thickness of the conductive layer is 300 nm or more. The AD method will be described later.

The adhesive layer 11 is an intermediate layer disposed between the conductive layer 12 and the substrate 10 so as to bring them into close contact. Here, since the conductive layer 12 is formed in accordance with a sputtering method, a vacuum deposition method or the like, it has relatively low adhesion to the under layer. Accordingly, in the embodiment, the adhesive layer 11 having a thickness on the order of 20 nm to 100 nm, more preferably, a thickness of 20 nm to 50 nm is formed between the conductive layer 12 and the substrate 10 so as to bring them into close contact.

Generally, as the adhesive layer, a material like titanium (Ti) that has high adhesion between the conductive layer and the substrate is used. However, in the manufacturing process of the laminated structure, heat-treating of a piezoelectric material is performed, and at this step, oxygen is transmitted through the conductive layer and introduced into the adhesive layer. Thereby, the adhesive layer is oxidized, and the bonding state between the adhesive layer and the conductive layer or the bonding state between the adhesive layer and the substrate changes so that the adhesion becomes lower. Accordingly, in the embodiment, titanium oxide ($TiO_2$) is used as the adhesive layer 11. Since the material that has been oxidized in advance never changes when the oxygen generated at the step of heat-treating PZT and transmitted through the conductive layer 12 penetrates the adhesive layer 11, adhesion can be maintained. As the adhesive layer 11, not only the titanium oxide ($TiO_2$), but also titanium oxide ($Ti_xO_Y$ where (X,Y)= (1,1), (2,3), (3,5)), tantalum oxide ($Ta_2O_5$), chromium oxide ($Cr_xO_Y$ where (X,Y)=(1,1), (1,3), (2,3)), and a metal oxide including an oxide of at least one of zirconium (Zr), aluminum (Al), nickel (Ni), hafnium (Hf), vanadium (V), magnesium (Mg), niobium (Nb) and tungsten (W) can be used.

The dielectric layer 13 is, for example, a PZT layer having a thickness on the order of 100 μm.

In the upper electrode, the conductive layer 15 is, for example, a platinum layer and used for applying a voltage to the dielectric layer 13. Further, the adhesive layer 14 is, for example, a titanium oxide layer and disposed so as to bring the conductive layer 15 in close contact with the dielectric layer 13. In the case where the upper electrode is formed after heat-treating of the dielectric layer 13, titanium (Ti) having high adhesion between platinum and PZT may be used as the adhesive layer 14.

Next, a laminated structure according to the second embodiment of the present invention will be described by referring to FIG. 2.

Figure 2:
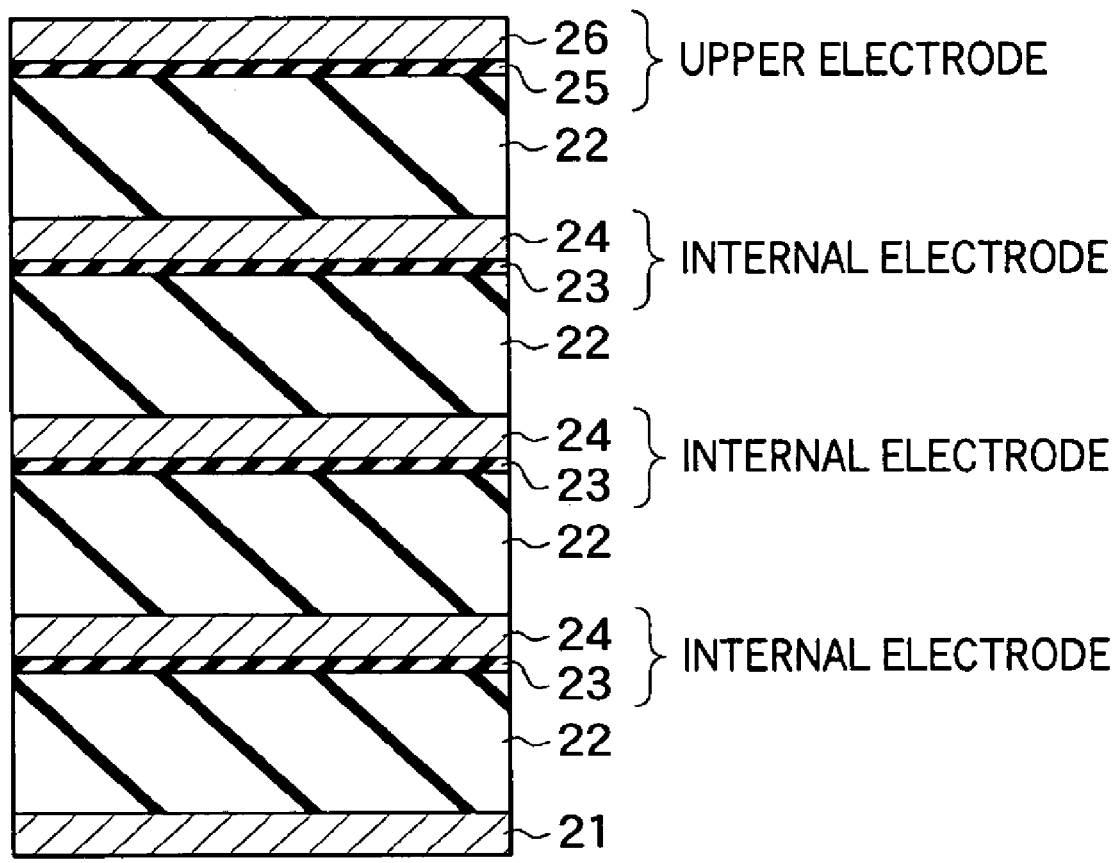
FIG. 2 is a sectional view showing a laminated structure according to the second embodiment of the present invention.

The laminated structure 2 as shown in FIG. 2 includes a lower electrode 21, plural dielectric layers 22, plural internal electrodes (also referred to as "intermediate electrodes") each having an adhesive layer 23 and a conductive layer 24, and an upper electrode having an adhesive layer 25 and a conductive layer 26. In the structure in which plural dielectric layers and internal electrodes are alternately stacked, the area of the opposed electrodes can be increased as the whole structure compared with a single-layer structure, and thereby, the electric impedance can be decreased. Therefore, compared with the single-layer structure, the structure of the embodiment operates efficiently with the applied voltage.

The lower electrode 21 is, for example, a platinum layer and has a thickness on the order of 300 nm in consideration of the thickness of the anchor layer produced when the dielectric layer 22 is formed thereon.

The dielectric layer 22 is a PZT layer having a thickness on the order of 100 μm for example. The upper surface of the dielectric layer 22 (on the adhesive layer 23 side) has roughness (surface roughness) of at least 0.3 μm. In the embodiment, the dielectric layer 22 is combined to the conductive layer 24 with the adhesive layer 23 therebetween. However, in the manufacturing process of the laminated structure, when heat-treating of the dielectric layer (PZT layer) is performed, stress is generated due to difference between coefficients of thermal expansion of the dielectric layer and the adhesive layer, and they become easier to be separated from each other. Accordingly, the contact area between the dielectric layer and the adhesive layer is increased by roughening the upper surface of the dielectric layer 22, and thereby, the stress generated due to difference between coefficients of thermal expansion is absorbed. Regarding the value of roughness, it has been confirmed by the observation with an AFM (atomic force microscope) that, in the case where the value is 0.3 μm or more, the dielectric layer and the adherent layer are not separated.

In the internal electrodes, the conductive layer 24 are used for applying electric fields to the dielectric layers 22 disposed on both sides thereof. The material and thickness of the conductive layer 24 are the same as those of the conductive layer 12 as shown in FIG. 1. Further, the adhesive layer 23 is an intermediate layer disposed between the conductive layer 24 and the dielectric layer 22 in order to bring them in close contact. The function, material and thickness of the adhesive layer are the same as those of the adhesive layer 11 as shown in FIG. 1.

The upper electrode including the adhesive layer 25 and the conductive layer 26 is the same as the adhesive layer 14 and the conductive layer 15 in constitution.

Here, in the embodiment, no adhesive layer is provided between the dielectric layer 22 and the conductive layer 24 underneath. The reason is as follows. In the case where the dielectric layer is formed in accordance with the AD method, owing to the anchoring which means that the powder of the piezoelectric material cuts into the electrode layer as a lower layer, high adhesion can be held between those layers.

Next, a laminated structure according to the third embodiment of the present invention will be described by referring to FIG. 3.

Figure 3:
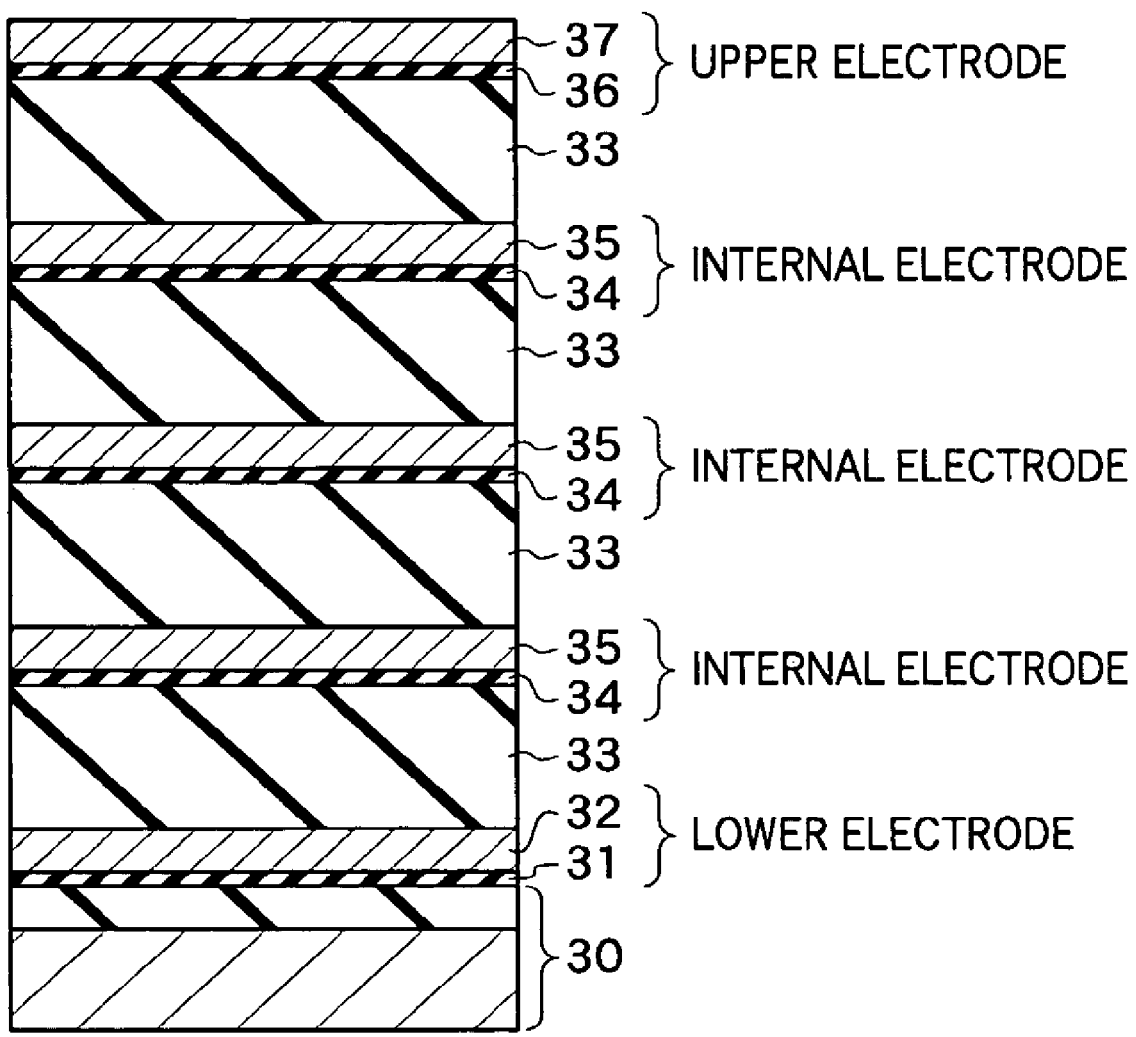
FIG. 3 is a sectional view showing a laminated structure according to the third embodiment of the present invention.

The laminated structure 3 as shown in FIG. 3 is a laminated structure in which the same structure as that of the laminated structure 2 as shown in FIG. 2 is formed on a substrate 30. The laminated structure 3 includes the substrate 30, a lower electrode having an adhesive layer 31 and a conductive layer 32, plural dielectric layers 33, plural internal electrodes each having an adhesive layer 34 and a conductive layer 35, and an upper electrode having an adhesive layer 36 and a conductive layer 37.

The substrate 30 is for backing the laminated structure stacked thereon. The substrate 30 is formed by employing, for example, silicon (Si), and an insulating film ($SiO_2$) is formed on the upper surface thereof for electrically insulating the layer formed thereon.

In the lower electrode, the adhesive layer 31 is an intermediate layer disposed between the conductive layer 32 and the substrate 30 so as to bring them into close contact. The function and material of the adhesive layer 31 are the same as those of the adhesive layer 11 as shown in FIG. 1.

The constitution of the respective layers 32 to 37 stacked on the substrate 30 are the same as the respective layers 21 to 26 in the laminated structure 2 as shown in FIG. 2.

Figure 4:
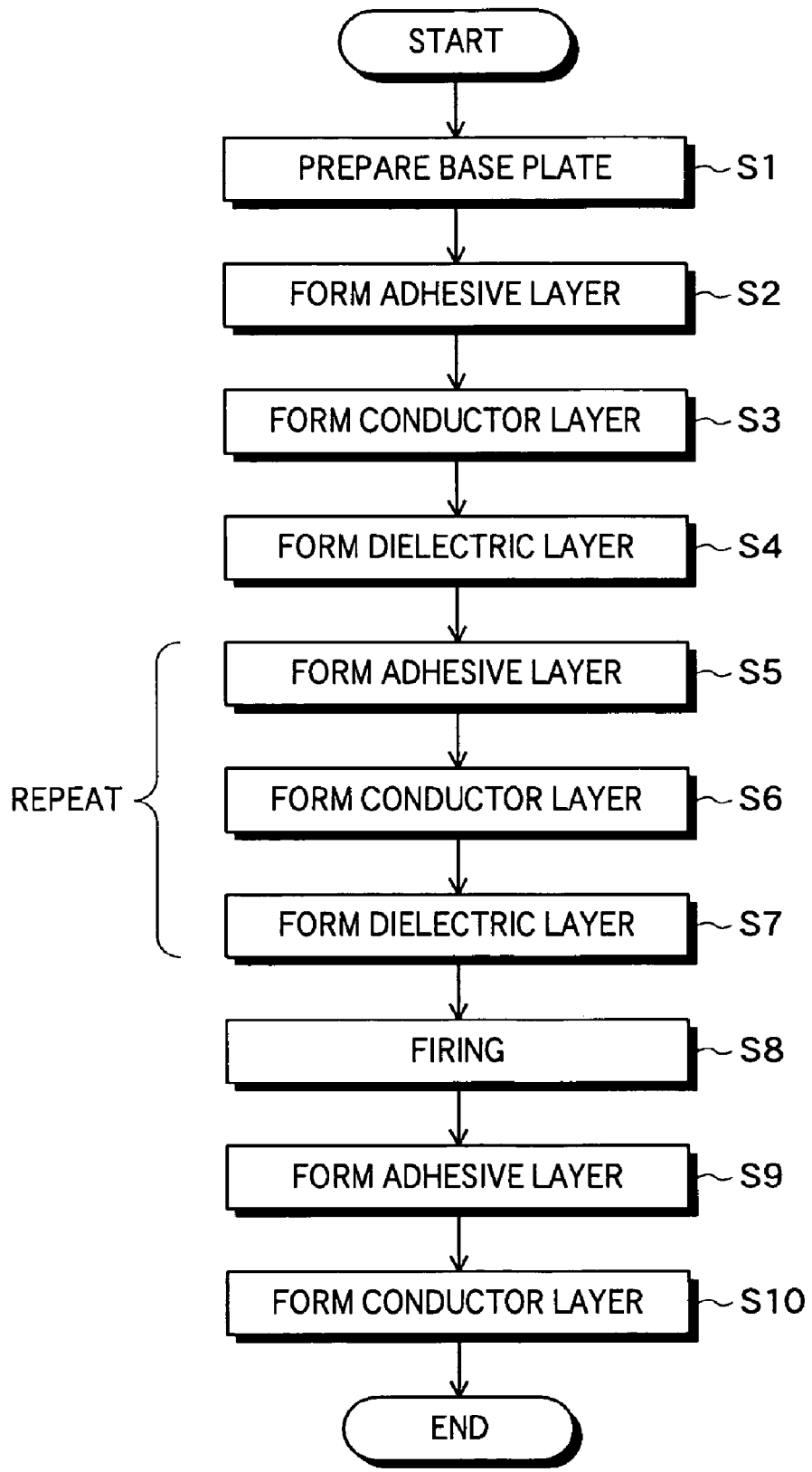
FIG. 4 is a flowchart showing a method of manufacturing a laminated structure according to one embodiment of the present invention.

Next, a method of manufacturing a laminated structure according to one embodiment of the present invention will be described by referring to FIGS. 3-5. FIG. 4 is a flowchart showing the method of manufacturing a laminated structure according to this embodiment.

At step S1 in FIG. 4, the substrate 30 for backing the laminated structure is prepared. That is, a silicon substrate having a predetermined size is prepared and thermal oxidation treatment is performed to form an insulating film ($SiO_2$) on at least one surface of the silicon substrate.

Then, at steps S2 and S3, the lower electrode is formed. That is, at step S2, a titanium oxide layer as the adhesive layer 31 is formed on the substrate 30 by sputtering or the like, and, at step S3, a platinum layer as the conductive layer 32 is formed thereon by sputtering or the like.

Then, at step S4, the dielectric layer 33 is formed on the conductive layer 32. In the embodiment, a PZT layer as the dielectric layer is formed in accordance with the AD method.

Figure 5:
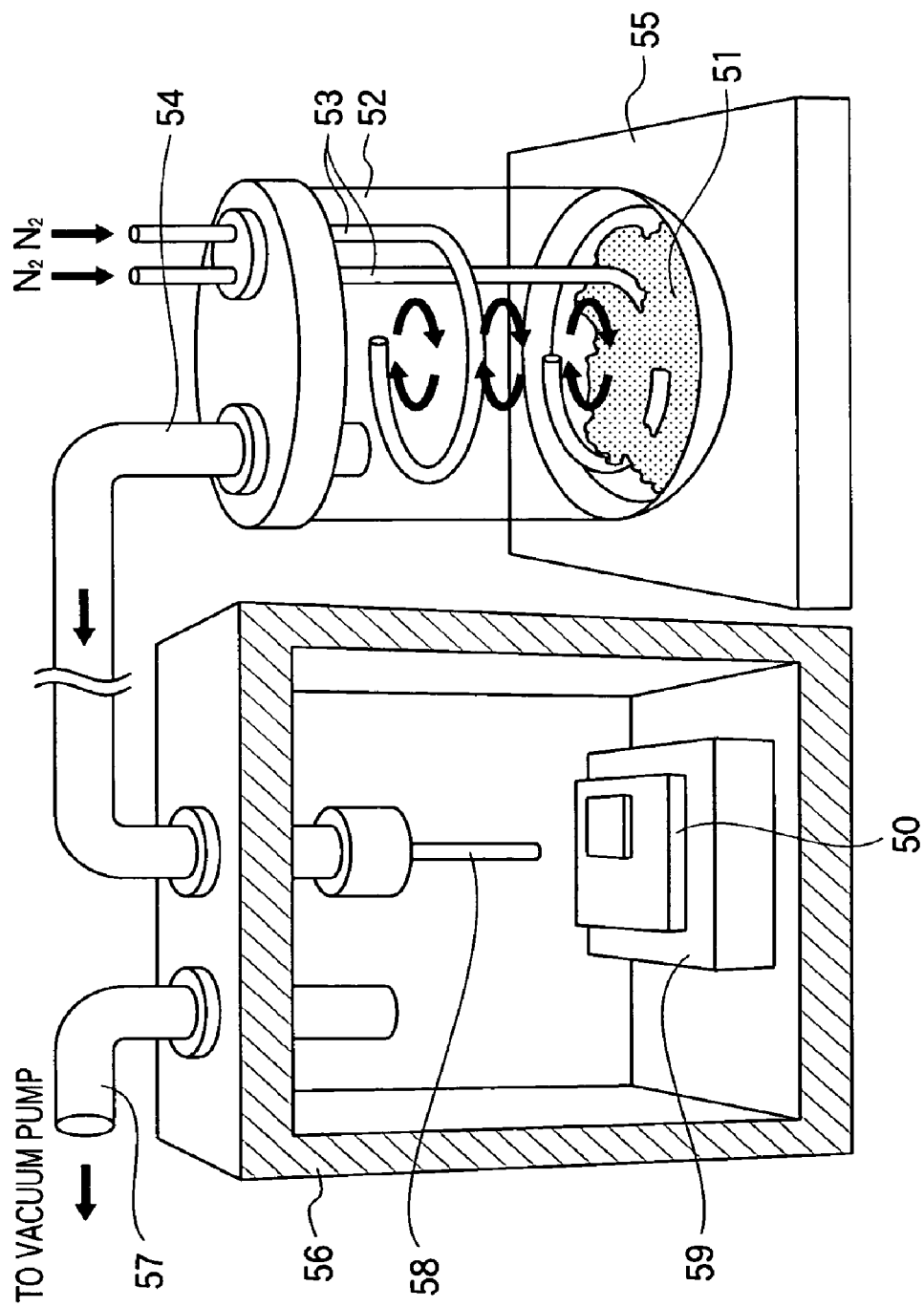
FIG. 5 is a schematic diagram showing the constitution of a film forming device according to an aerosol deposition method.

FIG. 5 is a schematic diagram showing a film forming device according to the AD method. The film forming device has an aerosol generating container 52 in which powder 51 of a row material is located. Here, the aerosol refers to fine particles of a solid or liquid floating in a gas. In the aerosol generating container 52, a carrier gas lead-in part 53, an aerosol lead-out part 54, and a vibrating part 55 are provided. By introducing a gas such as nitrogen gas ($N_2$) from the carrier gas lead-in part 53, the row material powder located within the aerosol generating container 52 is blown up to generate the aerosol. Simultaneously, by applying vibration to the aerosol generating container 52 by the vibrating part 55, the row material powder is agitated so as to generate the aerosol efficiently. The generated aerosol is guided through the aerosol lead-out part 54 to a film forming chamber 56.

In the film forming chamber 56, an exhaust pipe 57, a nozzle 58, and a movable stage 59 are provided. The exhaust pipe 57 is connected to a vacuum pump and exhausts air from inside of the film forming chamber 56. The aerosol generated in the aerosol generating container 52 and guided through the aerosol lead-out part 54 to the film forming chamber 56 is sprayed from the nozzle 58 toward the substrate 50. Thereby, the raw material powder impinges on the substrate 50 and is deposited thereon. The substrate 50 is mounted on the movable stage 59 movable in a three-dimensional manner, and the relative position between the substrate 50 and the nozzle 58 is adjusted by controlling the movable stage 59.

By employing, as the raw material, for example, PZT monocrystal powder having average particle diameter of 0.3 μm and driving the film forming device as shown in FIG. 5, the PZT layer (dielectric layer 33) as shown in FIG. 3 is formed on the conductive layer 32. Here, if the roughness is less than 0.3 μm on the upper surface of the formed PZT layer, the surface is roughened by using a surface treatment technology such as sandblasting.

Next, at steps S5 and S6, the internal electrode is formed. That is, at step S5, a titanium oxide layer as the adhesive layer 34 is formed on the dielectric layer 33 by sputtering or the like, and, at step S6, a platinum layer as the conductive layer 35 is formed thereon by sputtering or the like.

At step S7, in the same way as at step S4, the dielectric layer 33 is formed. By repeating steps S5 to S7, required number of the internal electrodes and the dielectric layers are alternately stacked.

At step S8, the laminated structure in which plural internal electrodes and plural dielectric layers are alternately stacked is heat-treated in an oxygen atmosphere or in the air at about 500° C. to 1000° C. Thereby, the grain size of the PZT crystal contained in the dielectric layer 33 is made larger.

At steps S9 and S10, the upper electrode is formed. That is, at step S9, a titanium oxide layer or titanium layer as the adhesive layer 36 is formed by sputtering or the like, and, at step S10, a platinum layer as the conductive layer 37 is formed thereon by sputtering or the like. Here, at step S9, there is no need to consider the roughness on the upper surface of the uppermost dielectric layer 33. This is because heat-treating has been completed at step S8 and it is not possible that the adhesive layer 36 is separated by the thermal stress. Thereby, the laminated structure 3 as shown in FIG. 3 is manufactured.

Alternatively, the upper electrode may be formed before the heat-treating at step S8. In this case, it is necessary to set the roughness on the upper surface of the uppermost dielectric layer 33 to 0.3 μm or more like other dielectric layers 33. Further, in this case, it is desired that a metal oxide such as titanium oxide is used as the material of the adhesive layer 36. This is because there is possibility that the adhesive layer is oxidized by the oxygen at the time of heat-treating if non-oxidized titanium or the like is used.

In order to manufacture the single-layer laminated structure 1 as shown in FIG. 1, steps S5 to S7 may be omitted in the manufacturing method as shown in FIG. 4.

Further, in order to manufacture the laminated structure 2 as shown in FIG. 2, steps S2 to S3 may be omitted in the manufacturing method as shown in FIG. 4, and the substrate is removed from the dielectric layer 22 after step S10 and the lower electrode 21 is disposed on the surface from which the substrate has been removed.

Alternatively, steps S2 to S3 may be omitted in the manufacturing method as shown in FIG. 4, and the substrate may be removed from the dielectric layer 22 after step S7, and then, heat-treating may be performed. Furthermore, a resist may be formed on the heat-treated laminated structure according to need, and then, the upper electrode, the lower electrode and side electrode may be formed in accordance with a plating method. In this case, the number of steps can be reduced by forming those electrodes at one time.

Figure 6A:
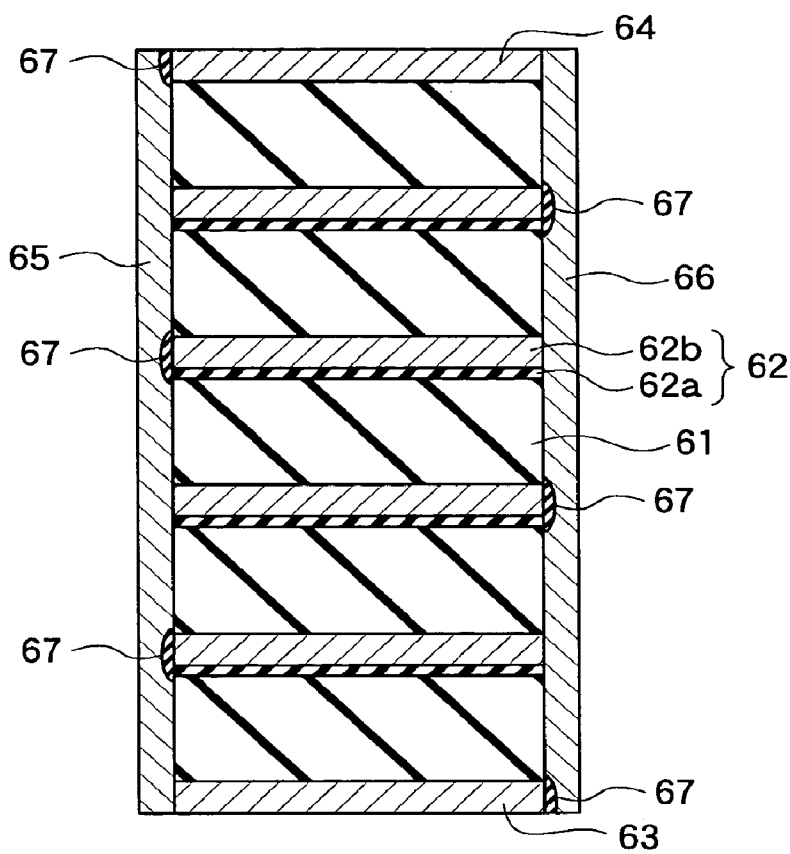
FIGS. 6A and 6B are sectional views showing the structure of a piezoelectric actuator according to one embodiment of the present invention.

FIG. 6A is a sectional view showing the structure of a piezoelectric actuator according to one embodiment of the present invention. This piezoelectric actuator is a laminated type actuator including piezoelectric layers 61, two kinds of internal electrodes 62 each having an adhesive layer 62a and a conductive layer 62b, a lower electrode 63 and an upper electrode 64 and two side electrodes 65 and 66.

As shown in FIG. 6A, a first group of internal electrodes 62 and the lower electrode 63 are connected to the side electrode 65 and insulated from the side electrode 66 by insulating portions 67 formed on end surfaces of the respective electrodes. Contrary, a second group of internal electrodes 62 and the upper electrode 64 are connected to the side electrode 66 and insulated from the side electrode 65 by insulating portions 67 formed on end surfaces of the respective electrodes. By thus forming the electrodes 62 to 66, actuator structures each including the piezoelectric layer and the electrodes that sandwich the piezoelectric layer are connected in parallel. In such laminated structure, the impedance of the piezoelectric actuator can be decreased and driving ability can be increased while microfabricating the element.

Figure 6B:
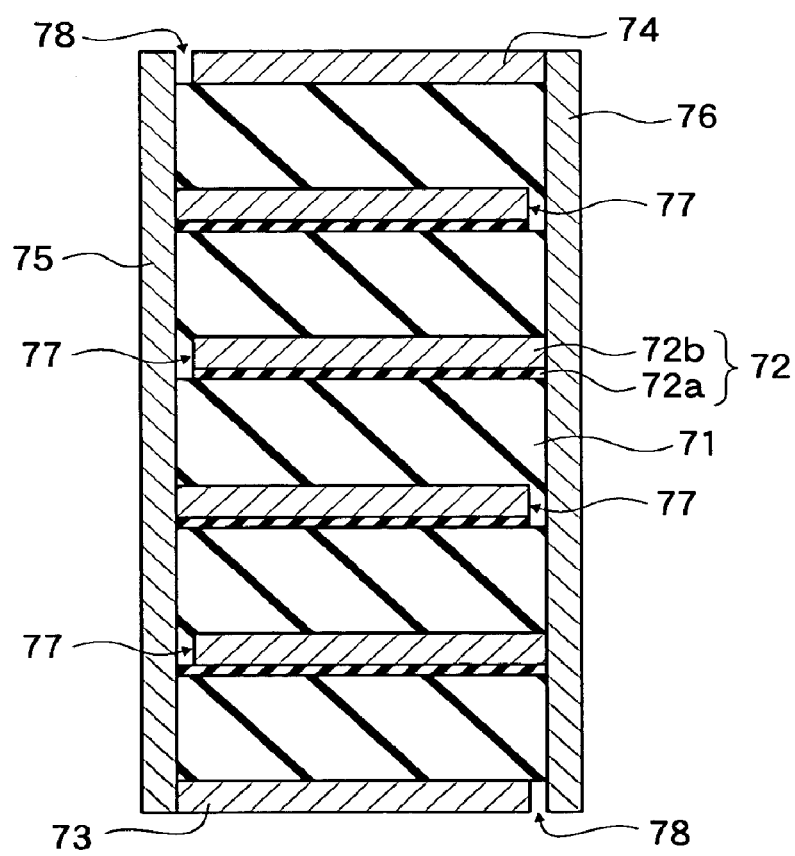

FIG. 6B is a modified example of the piezoelectric actuator as shown in FIG. 6A. This piezoelectric actuator includes piezoelectric layers 71, two kinds of internal electrodes 72 each having an adhesive layer 72a and a conductive layer 72b, a lower electrode 73, an upper electrode 74 and two side electrodes 75 and 76. In the piezoelectric actuator, a first group of internal electrodes 72 are connected to the side electrode 75, and insulated from the side electrode 76 by covering the end surfaces 77 thereof with the piezoelectric layers 71 thereon. Contrary, a second group of internal electrodes 62 are connected to the side electrode 76, and insulated from the side electrode 75 by covering the end surfaces 77 thereof with the piezoelectric layers 71 thereon. Further, the lower electrode 73 is connected to the side electrode 75 and insulated from the side electrode 76 by insulating regions 78, while the upper electrode 74 is connected to the side electrode 76 and insulated from the side electrode 75 by insulating regions 78.

Next, a method of manufacturing a piezoelectric actuator according to one embodiment of the present invention will be described by referring to FIGS. 4 to 6A.

First, at step S1 and steps S4 to S7 in FIG. 4, by employing a piezoelectric material such as PZT as the material of the dielectric layer, the laminated structure in which the internal electrodes 62 each having an adhesive layer 62a and a conductive layer 62b and the piezoelectric layers 61 are alternately stacked is formed. Then, after removing the substrate from the laminated structure, heat-treating of the laminated structure is performed at step S8. Furthermore, by performing dicing afterwards, the laminated structure may be shaped and the end surfaces of the internal electrodes may be reliably exposed in the side surfaces of the laminated structure.

Then, on the lower and upper surfaces of the laminated structure, the lower electrode 63 and the upper electrode 64 are formed by sputtering or the like, respectively. These electrodes 63 and 64 may be formed before dicing.

Next, according to electrophoresis or the like, the insulating portions 67 are formed by disposing an insulating material such as glass on the end surfaces of the internal electrodes 62, the lower electrode 63 and the upper electrode 64 exposed in the side surfaces of the laminated structure. Furthermore, the side surfaces 65 and 66 are disposed by sputtering or the like, and thereby, the piezoelectric actuator as shown in FIG. 6A is completed.

Further, as another method of manufacturing the piezoelectric actuator according to the embodiment, as shown in FIG. 6B, the internal electrodes 72 may be formed so that only one end surfaces of the internal electrodes 72 may reach the side surfaces of the laminated structure. In this case, the other end surfaces of the internal electrodes 72 are covered by forming the piezoelectric layers 71 on the internal electrodes 72 afterwards.

Then, in the lower electrode 73 and the upper electrode 74, resists are formed in regions (insulating regions 78) desired to be insulated from the side electrodes 75 and 76, and then, plating treatment is performed around the laminated structure. Furthermore, after removing the resists, plating is removed by dicing the surfaces on which no electrode is required (in FIG. 6B, the front surface and the opposed surface thereto). Thereby, the piezoelectric actuator as shown in FIG. 6B is completed.

The electrode forming method by such plating method can be used when the piezoelectric actuator as shown in FIG. 6A is manufactured.

As described above, by fabricating a piezoelectric actuator by employing a laminated structure including an adhesive layer, manufacture yield can be improved. Further, since a dense and robust piezoelectric layer can be formed in accordance with the aerosol deposition method, the withstand voltage of the piezoelectric layer can be made higher and the piezoelectric actuator can be driven with a higher voltage.

The invention claimed is:

1. A method of manufacturing a laminated structure, said method comprising the steps of:
   (a) disposing a first electrode by forming a conductive layer on a backing substrate with an adhesive layer containing a metal oxide therebetween;
   (b) disposing a dielectric layer on said first electrode by spraying powder of a dielectric material to said first electrode for deposition;
   (c) heat-treating said dielectric layer; and
   (d) forming a second electrode on said dielectric layer.

2. A method of manufacturing a laminated structure, said method comprising the steps of:
   (a) disposing a first electrode by forming a conductive layer on a backing substrate with an adhesive layer containing a metal oxide therebetween;
   (b) disposing a dielectric layer on said first electrode by spraying powder of a dielectric material to said first electrode for deposition;
   (c) disposing a second electrode by forming a conductive layer on said dielectric layer with an adhesive layer containing a metal oxide therebetween;
   (d) disposing a dielectric layer on said second electrode by spraying powder of a dielectric material to said second electrode for deposition;
   (e) heat-treating said dielectric layers; and
   (f) forming a third electrode on said dielectric layer disposed at step (d).

3. The method according to claim 2, further comprising the step of:
   repeating steps (c) to (d) for a predetermined number of times.

4. A method of manufacturing a laminated structure, said method comprising the steps of:
   (a) disposing a dielectric layer by spraying powder of a dielectric material to a backing substrate for deposition;
   (b) disposing a first electrode by forming a conductive layer on said dielectric layer with an adhesive layer containing a metal oxide therebetween;
   (c) disposing a dielectric layer on said first electrode by spraying powder of a dielectric material to said first electrode for deposition;
   (d) heat-treating said dielectric layers;
   (e) forming a second electrode on said second dielectric layer disposed at step (c); and
   (f) removing said backing substrate from said dielectric layer.

5. The method according to claim 4, further comprising the step of:
   repeating steps (b) to (c) for a predetermined number of times.

* * * * *